United States Patent [19]
Yamakoshi et al.

[11] Patent Number: 4,859,966
[45] Date of Patent: Aug. 22, 1989

[54] CURRENT AMPLIFIER CIRCUIT AND A CURRENT AMPLIFYING TYPE DIFFERENTIAL CURRENT CONVERTER CIRCUIT

[75] Inventors: Akira Yamakoshi; Toyohiko Fujita; Kunihiko Tsukakoshi; Shinji Anraku, all of Tokyo, Japan

[73] Assignee: Seikosha Co., Ltd., Tokyo, Japan

[21] Appl. No.: 94,374

[22] Filed: Sep. 9, 1987

[30] Foreign Application Priority Data

Sep. 11, 1986 [JP] Japan .................. 61-214335
Sep. 11, 1986 [JP] Japan .................. 61-214336

[51] Int. Cl.$^4$ ............................................. H03F 3/04
[52] U.S. Cl. ................................... 330/288; 323/315
[58] Field of Search ................ 330/257, 288; 323/315, 323/316

[56] References Cited
U.S. PATENT DOCUMENTS 3,364,434 1/1968 Widlar .................................. 330/257
4,716,381 12/1987 Campbell ........................ 330/257 X Primary Examiner—James B. Mullins
Attorney, Agent, or Firm—Bruce L. Adams; Van C. Wilks

[57] ABSTRACT

A current amplifier circuit includes a first, second, third and fourth transistor, each having the same polarity. The first transistor is connected in series with the second transistor and both have the collector and base thereof electrically connected. The third and fourth transistors are connected in series and the fourth transistor has a resistor connected between the base and collector. The third transistor has its base connected to the collector of the first transistor. A bias current is applied to the collector of the first transistor and an input current to be amplified is applied to the base of the fourth transistor. An amplified output current is obtained across the collector to emitter of the third transistor. In a differential amplifier circuit, a fifth transistor having the same polarity is connected with its base connected to the collector of the fourth transistor through a resistor. Additionally a resistor is connected between the base of the third transistor and the collector of the first transistor. The differential current outputs are taken across the third transistor and fifth transistor.

18 Claims, 3 Drawing Sheets

CURRENT AMPLIFIER CIRCUIT AND A CURRENT AMPLIFYING TYPE DIFFERENTIAL CURRENT CONVERTER CIRCUIT

BACKGROUND OF THE INVENTION

This invention relates to a current amplifier circuit and a current amplifying type differential amplifier converter circuit.

Conventionally, there is a current amplifier circuit, for example, shown in FIG. 5. In operation, if bias currents flowing through transistors $T_6$, $T_7$ and transistors $T_8$, $T_9$ are represented by I, $I_B$ and $I_X$, respectively, the base voltage of transistor $T_8$ is given by $$2 \cdot (KT/q \cdot I/I_S)$$

where K is the Bolzmann constant, T is an absolute temperature, q is the electron charge and $I_S$ is the collector reverse saturation current. When $T = 300°$ K., $KT/q = 2 \cdot 26 \cdot 10^{-3}$, and the base voltage of the transistor $T_8$ is given by $$2 \cdot (26 \cdot 10^{-3} \ln I/I_S) = 26 \cdot 10^{-3} \cdot (\ln I_B/I_S + \ln I_X/I) \ln (I/I_S)^2 = \ln I_B I_X/I_S^2$$

Rearranging this equation as $I_B = I_X/hFE$, $$I^2 = I_X^2/hFE$$

Then $$I_X = I\sqrt{hFE}$$

Thus the biasing current $I_X$ flowing through transistor $T_8$ is $\sqrt{hFE}$ times as large as the biasing current I.

The current gain is approximately hFE/2 if an input current is represented by i.

In the above circuit arrangement, the biasing current $I_X$ and the current gain are greatly dependent on hFE and influenced by variations in the elements used, so that the arrangement is difficult to design and not suitable for integration.

The object of this invention is to provide a current amplifier circuit and a current amplifying type differential current converter circuit in which the biasing current and the current gain are less dependent on hFE and not influenced by variation in the elements used.

DETAILED DESCRIPTION OF THE PREFERRED EMBODIMENT

Figure 1:
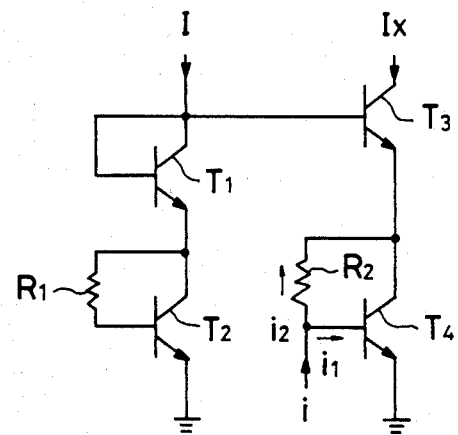
FIG. 1 is an electric circuit diagram showing one example of an electric amplifier circuit according to this invention.

In FIG. 1, a first transistor $T_1$ in diode connection is connected in series with a second transistor $T_2$ in diode connection and having a resistor $R_1$ connected across the collector and base thereof. The collector of transistor $T_1$ is connected to the base of a third transistor $T_3$.

A fourth transistor $T_4$ with a resistor $R_2$ across the collector and base thereof is connected in series with transistor $T_3$.

In the above arrangement, if the biasing currents flowing through transistors $T_1$, $T_2$ are shown by I and biasing currents flowing through transistors $T_3$, $T_4$ are shown by $I_X$, the base potential of transistor $T_3$ is given by $$26 \cdot 10^{-3} \ln I/I_S + 26 \cdot 10^{-3} \ln I/I_S + RI/hFE = 26 \cdot 10^{-3} \ln I_X/I_S + 26 \cdot 10^{-3} \ln I_X/I_S + RI_X/hFE$$

wherein $R_1 = R_2 = R$. Therefore, $$2 \cdot 26 \cdot 10^{-3} \ln I/I_X = (I_X - I) \cdot R/hFE$$

when $I_X = I$, the right and left sides are equal. Namely, the currents flowing through transistors $T_3$, $T_4$ are equal to those flowing through transistors $T_1$, $T_2$.

If an input current applied to the base of transistor $T_4$ is shown by i, it is divided into $i_1$, $i_2$, namely, $$i = i_1 + i_2$$

Thus a signal current component $I_{cs}$ of the collector current flowing through transistor $T_4$ is given by $$I_{cs} = hFE \cdot i_1$$

A voltage drop across the emitter resistance RE of each of transistors $T_3$, $T_4$ due to this current is given by $$2R \cdot I_{cs} = 2R_E \cdot hFE \cdot i_1$$

wherein $R_E$ is the AC emitter resistance of transistor $T_3$ and $R = R_1 = R_2$.

This voltage drop serves to reduce the voltage applied to resistor R to thereby reduce the current flowing through resistor $R_2$. This reduced portion equals current $i_2$, then $$i_2 = 2R_E hFE \cdot i_1/R$$

The current gain of this circuit is given by $$\begin{aligned} I_{cs}/i &= hFE \cdot i_2/(i_1 + (2R_E \cdot hFE \cdot i_1)/R) \\ &= hFE \cdot R/(R + 2R_E \cdot hFE) \\ &= R/(R/hFE + 2R_E) \end{aligned}$$

When hFE is large, Ics/i becomes approximately $R_E$ and hence the gain is determined irrespective of hFE. Accordingly, current Ix flowing through the collector of transistor $T_3$ can be represented as $$\begin{aligned} Ix &= I + Ics \\ &= I + \frac{Ri}{\frac{R}{hFE} + 2R_E} = I + \frac{Ri}{2R_E} \end{aligned}$$

when $R << hFE$

As just described above, the biasing current and current gain of the circuit according to this invention are not dependent on hFE of the transistors, so that the circuit is easy to design and suitable for integration.

Figure 2:
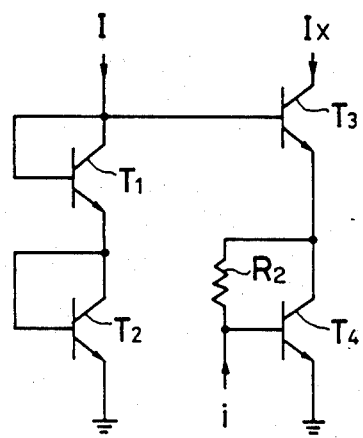
FIG. 2 is an electric circuit diagram showing another embodiment.

FIG. 2 shows another embodiment which includes a circuit obtained by eliminating resistor $R_1$ from the structure of FIG. 1. This circuit also provides substantially the same effect as the first mentioned embodiment except for biasing currents I and $I_x$ given by $$I/I_x = \mathrm{Exp}\,((R_2 I_x/hFE)/2 \cdot 26 \cdot 10^{-3})$$

when $R_2=0$, $I=I_x$.

Figure 3:
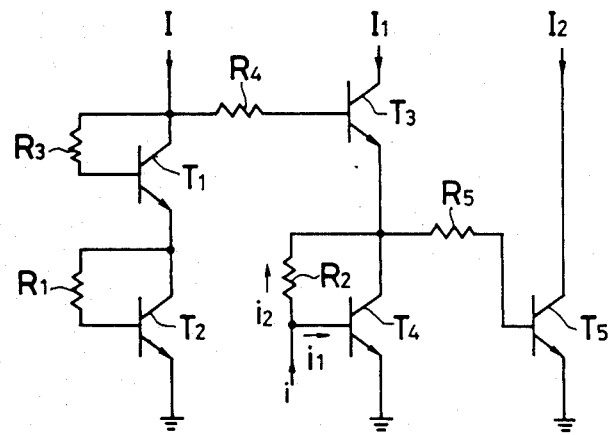
FIG. 3 is an electric circuit diagram showing one example of an electric current amplifier differential current converter circuit.

A current amplifying type differential current converter circuit constructed by utilizing the above techniques will now be described. In FIG. 3, first and second transistors $T_1$, $T_2$ are in diode connection through resistors $R_3$ and $R_1$, respectively. The collector of transistor $T_1$ is connected through a resistor $R_4$ to the base of third transistor $T_3$ to which a fourth transistor $T_4$ in diode connection through resistor $R_2$ is connected in series with transistor $T_3$. The collector of transistor $T_4$ is connected through a resistor $R_5$ to the base of a fifth transistor $T_5$.

In the above arrangement, if the biasing currents flowing through transistors $T_1$, $T_3$, $T_5$ are shown by I, $I_1$, $I_2$, respectively, the collector voltage of transistor $T_1$ is given by $$2(26 \cdot 10^{-3} \ln I/I_S + R \cdot I/hFE) = \\ 26 \cdot 10^{-3} (\ln I_1/I_S + \ln I_2/I_S) + R(I_1 + I_2)/hFE \quad (1)$$

when $R_1=R_2=R_3=R_4=R_5=R$.

The collector voltage of transistor $T_4$ is given by $$26 \cdot 10^{-3} \ln I_1/I_S + RI_1/hFE 26 \cdot 10^{-3} \ln I_2/I_S + RI_2/hFE \quad (2)$$

Rearranging this equation, $$26 \cdot 10^{-3} \ln I_1/I_2 = R \cdot (I_2 - I_1)/hFE \quad (3)$$

This equation holds when $I_1=I_2$, so that $I_1=I_2$. Substituting this into equation (1), $$2(26 \cdot 10^{-3} \ln I/I_1) = 2 \cdot R(I_1 - I)/hFE \quad (4)$$

This equation holds when $I_1=I$, so that $I_1=I$.

Namely, biasing currents I, $I_1$, $I_2$ are equal currents.

If a signal current i is applied to the base of transistor $T_4$, it is divided into $i_1$ and $i_2$. If the emitter resistances of transistors $T_3$ and $T_4$ are shown by $R_E$, then $$i_2 = (i_1\, hFE \cdot 2R_E + R \cdot i_1\, hFE/hFE)/R \quad (5)$$

$$i = i_1 + i_2 \quad (6)$$

Substituting equation (6) into (5) and eliminating $i_2$, $$i = 2i_1 + (i_1 \cdot hFE \cdot 2R_E)/R \quad (7)$$

$$\mathrm{LU}\; i_i/i = 1/(2 + (2R_E \cdot hFE)/R) \quad (8)$$

Since the current flowing through transistor $T_4$ is $hFE \cdot i$, the current gain of transistor $T_4$ is given by $$i_1\, hFE/i = hFE/(2R_E \cdot hFE)/R \quad (9)$$

In this equation, as hFE increases, the current gain becomes approximately $R/2R_E$.

If the amplified current is given by $I_a$, the signal current $I_x$ flowing through transistor T5 is given by $$2(26 \cdot 10^{-3} \ln I/I_S + RI/hFE) = \\ 26 \cdot 10^{-3} (\ln(I + I_a)/I_S + \ln(I + I_x)/I_S + \\ (R/hFE)\{(I + I_a) + (I + I_x)\} \quad (10)$$

from the relationship with the collector voltage of transistor $T_1$. Transforming this equation, $$26 \cdot 10^{-3} \ln \\ I^2/(I+I_a)(I+I_x) = R/hFE(I+I_a+I+I_x-2I) \quad (11)$$

When currents $I_a$, $I_x$ are at a small-signal level, the equation (11) holds when $I_x = -I_a$. Therefore, $I_x = -I_a$, so that a current flows through transistor $T_5$, which current has a phase opposite to that of a signal current flowing through transistor $T_4$.

Accordingly, collector current $I_1$ of the transistor $T_4$ and collector current $I_2$ of the transistor $T_5$ are represented as, $$I_1 = I + I_a = i + R/(2R_E)i$$

$$I_2 = I + I_x = I - I_a \approx I - Ri/2R_E$$

Thus, the above arrangement provides an electric current amplifying type differential conversion circuit.

Figure 4:
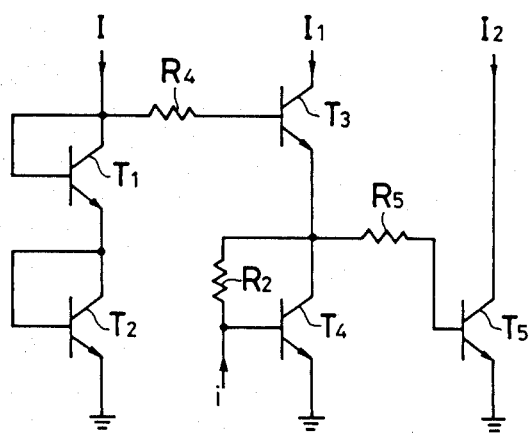
FIG. 4 is an electric circuit diagram showing another embodiment.
Figure 5:
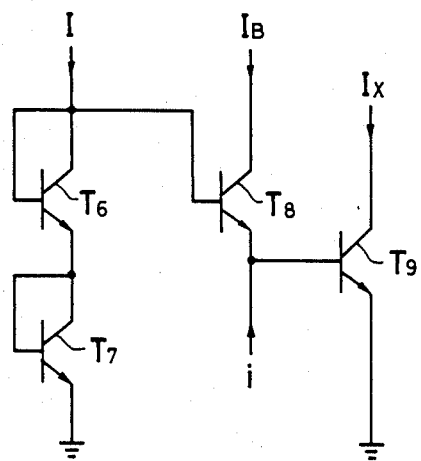
FIG. 5 is an electric circuit diagram showing one example of conventional current amplifier circuits.

FIG. 4 shows an embodiment in which transistors $T_1$, $T_2$ have no resistors across the bases and emitters thereof and have an effect similar to that of the previous embodiment. In this circuit, the relationship between biasing currents I, $I_1$, and $I_2$ is given by $$I_1 = I_2$$

$$I/I_1 = \mathrm{Exp}\,(R \cdot I_1/26 \cdot 10^{-3}\, hFE) \quad (12)$$

When $R=R_2=R_4=R_5=0$, $I=I_1$.

According to this invention, the biasing currents and the current gain are less dependent on hFE, and less influenced by variations in the components, so that the circuit is easy to design and is suitable for integration.

I claim:

1. An electric current amplifier circuit comprising: a first, a second, a third and a fourth transistor each having the same polarity, wherein the first transistor has an electrically connected collector and base and is connected in series with the second transistor having an electrically connected collector and base, wherein the collector of the first transistor is connected to a base of the third transistor, wherein the fourth transistor has an emitter with a resistance $R_E$ and a collector and base connected through a resistor having a resistance R and the fourth transistor is connected in series with the third transistor, wherein the first transistor is receptive of a bias current I flowing therethrough, and wherein the base of the fourth transistor is receptive of an input signal current i supplied thereto to produce an amplified output signal current approximately $I + R \cdot i/2R_E$ flowing through the third transistor.

2. An electric current amplifier circuit according to claim 1, wherein the collector and the base of the first transistor are directly electrically connected and the collector and the base of the second transistor are electrically connected through a resistor.

3. An electric current amplifier circuit according to claim 1, wherein the collector and the base of the first transistor are directly electrically connected and the collector and the base of the second transistor are directly electrically connected.

4. An electrical current amplifier circuit according to claim 1, wherein the first transistor has an emitter connected to the collector of the second transistor to effect the series connection thereof and wherein the third transistor has an emitter connected to the collector of the fourth transistor to effect the series connection thereof.

5. An electric current amplifying type differential current conversion circuit comprising a first, a second, a third, a fourth and a fifth transistor, each having the same polarity, wherein the first transistor has an electrically connected collector and base and is connected in series with the second transistor having an electrically connected collector and base, wherein the collector of the first transistor is connected to a base of the third transistor through a first resistor, wherein the fourth transistor has an emitter with a resistance $R_E$ and a collector and base connected through a second resistor, wherein the fourth transistor is connected in series with the third transistor, wherein the fifth transistor has a base connected to the collector of the fourth transistor through a third resistor wherein the resistance of the first, second and third resistors is R, wherein the first transistor is receptive of a bias current I flowing therethrough and wherein the base of the fourth transistor is receptive of an input signal current i to produce differential amplified output signal currents of approximately $I+R\cdot i/2R_E$, $I-R\cdot i/2R_E$, flowing through the third transistor and the fifth transistor respectively.

6. An electric current amplifying type differential current conversion circuit according to claim 5, wherein the collector and the base of the first transistor are electrically connected through a resistor and the collector and the base of the second transistor are electrically connected through a resistor.

7. An electric current amplifying type differential current conversion circuit according to claim 5, wherein the collector and the base of the first transistor are directly electrically connected and the collector and the base of the second transistor are directly electrically connected.

8. An electrical current amplifying type differential current conversion circuit according to claim 5, wherein the first transistor has an emitter connected to the collector of the second transistor to effect the series connection thereof and wherein the third transistor has an emitter connected to the collector of the fourth transistor to effect the series connection thereof.

9. A current amplifier circuit comprising:
first and second series connected transistors having the same polarity and each having an electrically connected base and collector;
third and fourth series connected transistors having the same polarity as the first and second transistors, wherein the third transistor has a base connected to the collector of the first transistor and the fourth transistor has a collector and a base and a resistor having a resistance R connected between the collector and base thereof;
means for applying a bias current I to the collector of the first transistor;
input means for applying input current i to be amplified to the base of the fourth transistor; and
output means for providing an amplified output current across a collector and emitter of the third transistor.

10. The circuit according to claim 9, wherein the fourth transistor has an emitter resistance of $R_E$ and the output current is approximately $I+R\cdot i/2R_E$.

11. The circuit according to claim 9, wherein the base and collector of the first transistor are directly connected and wherein the base and collector of the second transistor are connected through a resistor.

12. The circuit according to claim 9, wherein the base and collector of the first transistor are directly connected and wherein the base and collector of the second transistor are directly connected.

13. The circuit according to claim 9, wherein the first transistor has an emitter connected to the collector of the second transistor to effect the series connection thereof and wherein the third transistor has an emitter connected to the collector of the fourth transistor to effect the series connection thereof.

14. A differential current amplifier circuit comprising:
first and second series connected transistors having the same polarity and each having an electrically connected base and collector;
third and fourth series connected transistors having the same polarity as the first and second transistors, wherein the third transistor has a base connected to the collector of the first transistor through a first resistor and the fourth transistor has a collector and a base and a second resistor connected between the collector and base thereof;
a fifth transistor having the same polarity as the first and second transistors and a base connected to the collector of the fourth transistor through a third resistor;
means for applying a bias current I to the collector of the first transistor;
input means for applying input current i to be amplified to the base of the fourth transistor; and
output means for providing two amplified differential output current across a collector and emitter of the third transistor and the fifth transistor.

15. The circuit according to claim 14, wherein the first, second and third resistors have a resistance R and wherein the fourth transistor has an emitter resistance of $R_E$ and the differential output currents across the third and fifth transistors respectively are approximately $I+R\cdot i/2R_E$ and $I-R\cdot i/2R_E$.

16. The circuit according to claim 14, wherein the base and collector of the first transistor are connected through a resistor and wherein the base and collector of the second transistor are connected through a resistor.

17. The circuit according to claim 14, wherein the base and collector of the first transistor are directly connected and wherein the base and collector of the second transistor are directly connected.

18. The circuit according to claim 14, wherein the first transistor has an emitter connected to the collector of the second transistor to effect the series connection thereof and wherein the third transistor has an emitter connected to the collector of the fourth transistor to effect the series connection thereof.

* * * * *